United States Patent
Choi

(10) Patent No.: US 7,085,088 B2
(45) Date of Patent: Aug. 1, 2006

(54) METHOD OF CONTROLLING READER AMPLIFIER GAIN VARIATIONS OF A HDD PREAMPLIFIER, OR THE LIKE

(75) Inventor: Davy H. Choi, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 412 days.

(21) Appl. No.: 10/154,679

(22) Filed: May 23, 2002

(65) Prior Publication Data

US 2003/0218817 A1 Nov. 27, 2003

(51) Int. Cl.
*G11B 5/03* (2006.01)
(52) U.S. Cl. .......................... 360/67; 360/66
(58) Field of Classification Search ............... 360/66, 360/67; 330/252, 251
See application file for complete search history.

(56) References Cited

U.S. PATENT DOCUMENTS

| | | | | |
|---|---|---|---|---|
| 5,323,124 A | * | 6/1994 | Ikeda | 330/288 |
| 5,481,180 A | | 1/1996 | Ryat | |
| 5,694,083 A | * | 12/1997 | Umeyama et al. | 360/67 |
| 5,781,360 A | * | 7/1998 | Wilson et al. | 360/77.08 |
| 5,969,569 A | * | 10/1999 | Marceau et al. | 327/574 |
| 6,204,980 B1 | * | 3/2001 | Momtaz et al. | 360/29 |
| 6,282,046 B1 | * | 8/2001 | Houston et al. | 360/73.03 |
| 6,337,778 B1 | * | 1/2002 | Gagne | 360/51 |
| 6,549,072 B1 | * | 4/2003 | Vernon | 330/252 |

OTHER PUBLICATIONS

"Microelectronic Circuits" 4th Ed., 1998, Sedra/Smith, pp. 354-416.*
Neamen, Electronic Circuit Analysis and Design, WCB McGraw-Hill, 1996, p. 403.
Pan et al, A Wide-Band CMOS Read Amplifier for Magnetic Data Storage Systems, IEEE J of Solid-State Circuits, vol. 27, No. 6, Jun. 1992 pp. 863-873.

* cited by examiner

*Primary Examiner*—David Hudspeth
*Assistant Examiner*—Glenda P Rodriguez
(74) *Attorney, Agent, or Firm*—W. Daniel Swayze, Jr.; W. James Brady; Frederick J. Telecky, Jr.

(57) ABSTRACT

An amplifier (70) has a differential input stage (84,86). An output transistor (102) is connected to receive a single ended output developed by transistor 86. First (74) and second (76) current sources are connected to establish respective first and second currents in the input differential transistors (84,86) according to a predetermined ratio. First and second voltages are subtracted from the differential inputs (VM,VP) in respective differential amplifiers (88,90), and the output is derived from the output transistor having a magnitude proportional to an inverse of a product of a square of the reference resistance, a carrier mobility, and an oxide capacitance.

25 Claims, 3 Drawing Sheets

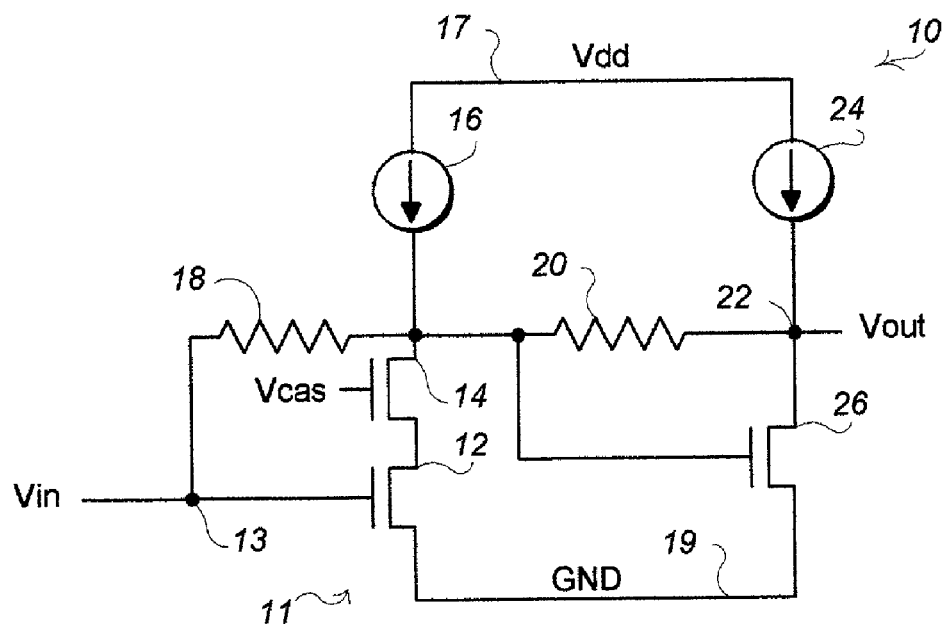
FIG. 1 *(PRIOR ART)*
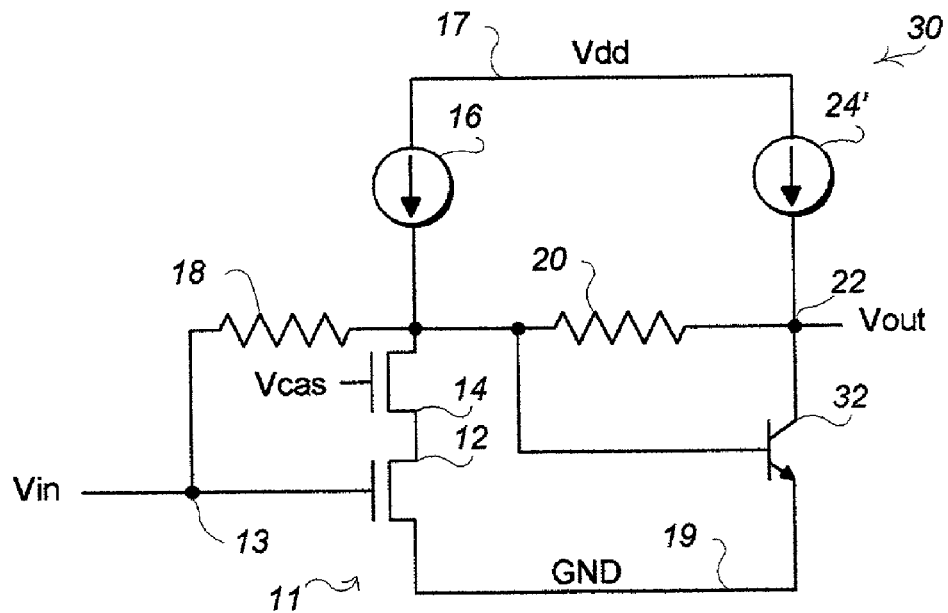
FIG. 2

METHOD OF CONTROLLING READER AMPLIFIER GAIN VARIATIONS OF A HDD PREAMPLIFIER, OR THE LIKE

BACKGROUND OF THE INVENTION

1. Field of the Invention

This invention relates to improvements in circuitry and methods useful in mass data storage devices, or the like, and more particularly, to improvements in circuitry and methods for controlling gain variations in a reader amplifier used in amplifying signals of an MR head, or the like, in a hard disk drive system.

2. Relevant Background

Mass data storage devices include, for example, hard disk drives, CD-ROM devices, DVD devices, high capacity floppy disk devices, tape drives and other magnetic recording storage devices, and optical storage devices or like family of devices onto which data is recorded for storage and subsequent retrieval. Hard disk drives, for instance, may be used in many applications, including personal computers, set top boxes, video and television applications, audio applications, or some mix thereof. Applications for hard disk drives are still being developed, and are expected to further increase in the future.

Typically, the data transducer used in mass data storage devices, whether optical or magnetic, produce an analog output signal that is detected and processed to reproduce the data that is recorded on the data recording media. The analog signal is generally amplified by an open loop amplifier to produce an amplified signal for data detection and processing.

One classic open-loop amplifier design that has been used has a bipolar input gain stage. Typically, such amplifier is biased with a current that is equal to a PTAT (Proportional to Absolute Temperature) voltage divided by a resistance, for instance, that may be provided by an internal or on-chip resistor (Rint). This is intended to generally maintain the gain of the stage despite process and temperature variations.

Recently, MOS input stage amplifier designs have been becoming more popular. However, low voltage designs using MOS input gain stage require different biasing methods. In a conventional MOS input stage design, a PTAT/Rint current may still be used for biasing. The internal resistance, Rint, is typically provided by a resistance internal to the gain stage, for instance, as an integrated circuit resistance, and is referred to herein as a reference resistor. Such a design, however, may have greater than ±20% of gain variations due to process and temperature variations. Alternatively, using a current that is equal to a bandgap reference voltage divided by the internal resistance, Rint, may have even larger gain variations, which may, in fact, exceed ±30%.

Nevertheless, users of such amplifiers often have strict design requirements. It is not unusual to have gain variation specification limits that are less than or equal to 20%. Consequently, in order to meet these specifications, IC vendors typically resort to expensive fuse trimming techniques to remove the process variation contributions to the gain variations. Once the process variations have been controlled, the remaining gain movement due to temperature variations is then generally less than 20%, thereby meeting the specification requirement.

One of the undesired results of large gain variations in low voltage reader amplifiers is that noise referred at the amplifier input is affected by the gain changes resulting from the stabilization technique for process and temperature variations. Thus, as the gain changes, for example, by decreasing, for such process and temperature variations, the noise at the input of the amplifier also increases. This makes adherence to the ±20% specification difficult over the range of temperature and process variations expected.

One circuit 10 that has been proposed is shown in FIG. 1, to which reference is now made. The CMOS core circuit 10 includes a first stage cascade amplifier 11 that includes an input transistor 12 to the gate of which the input signal, Vin, is applied on line 13 and a cascode transistor 14 connected in series with the input transistor 12 in a cascode configuration. A constant bias voltage, Vcas, is connected to the gate of the cascode transistor 14, which serves to reduce the amplifier input capacitance by reducing the Miller capacitance of the drain of transistor 12 when it is referred back to the amplifier input. The cascode transistor 14 improves the frequency response of the amplifier.

A current source 16 is connected in series with transistors 12 and 14 between a voltage supply line 17, Vdd, and a ground line 19, and a resistor 18 is connected between the input line 13 and the drain of the control transistor 14. A load element, such as the load resistor 20 shown, is connected between the drain of the control transistor 14 and the output node 22. A current source 24 and an output transistor 26 are connected n series between the supply line 17 and ground line 19, the junction node 22 therebetween providing the output from the circuit 10.

An extension of the circuit 10 of FIG. 1 is shown in FIG. 2, to which reference is now additionally made, which shows a BiCMOS circuit embodiment 30. The circuit elements in the BiCMOS circuit embodiment 30 may be the same as those of the all CMOS circuit embodiment 10, except that the output amplifier transistor 32 may be an npn bipolar transistor. The operation of the BiCMOS circuit embodiment 30 of FIG. 2 is essentially the same as that of the all CMOS circuit embodiment 10 of FIG. 1, except that the substitution of the bipolar transistor 32 for the MOS transistor 26 produces a greater frequency bandwidth in the circuit 30. In the circuit 30, the value of the current source 24' may be PTAT/Rint to control the input resistance of the circuit. In the circuit embodiments shown, Rint is not specifically shown, but may be provided by a reference resistor on the same integrated circuit chip onto which the remaining circuitry is also constructed. Nevertheless, one of the goals in the design of the circuits according to the invention is to establish a circuit in which the terms in the current equations are inversely proportional to the product of this resistance squared, the carrier mobility, and the oxide capacitance.

What is needed, therefore, is an MOS input stage amplifier design that does not require expensive fuse trimming techniques, yet still has low gain variations over a wide range of temperature variations.

SUMMARY OF THE INVENTION

It is an advantage of the invention that a cost-effective solution is provided to maintain preamplifier reader amplifier gain over a range of process and temperature variations, without requiring expensive fuse trimming.

It is another advantage of the invention that because fuse trimming is not required, the automatic test equipment test time otherwise required by fuse trimming is eliminated.

It is yet another advantage of the invention provides gain correction due to temperature change in a continuous-time fashion, without requiring fuse trimming techniques, which, although controlling gain variation due to process change, result in unpredictable gain variations due to temperature change.

These and other objects, features and advantages of the invention will be apparent to those skilled in the art from the following detailed description of the invention, when read in conjunction with the accompanying drawings and appended claims.

According to a broad aspect of the invention, an amplifier is presented which has an input transistor and an output transistor connected in cascade configuration. First and second current sources are connected to establish respective first and second currents in the input and output transistors, the first and second current sources supply bias currents that are proportional to an inverse of the product of the square of reference resistance, the carrier mobility, and the oxide capacitance. First and second resistors are connected between respective input and output terminals of the input and output transistors. The input and output transistors may be MOS transistors, or alternatively, the input transistor may be a MOS transistor and the output transistor may be a bipolar transistor. The resistor connected between input and output terminals of the output transistor may be an MOS transistor.

According to another broad aspect of the invention, a circuit is presented for controlling gain variations of an amplifier. The circuit includes first and second current sources to establish currents in respective first and second current flow paths and first and second input transistors respectively in the first and second current flow paths, an input signal being connected to a control element of the first transistor. A load element is connected between the first and second current flow paths to allow the first and second transistors to carry currents in proportion to an inverse of the product of an internal resistance squared, the carrier mobility, and the oxide capacitance. The load element may be, for example, a resistor or a transistor. The first and second transistors may be MOS transistors, or the first transistor may be a MOS transistor and the second transistor may be a bipolar transistor.

According to another broad aspect of the invention, a method for controlling gain variations of a two stage amplifier is shown. The method includes biasing a transistors of the two-stage amplifier wherein a transconductance of the transistors is inversely proportional to an internal circuit resistance. The biasing may be done by providing bias currents to the transistors that are inversely proportional to a product of a carrier mobility, an oxide capacitance, and the internal circuit resistance squared.

According to yet another broad aspect of the invention, a mass data storage device is provided that includes at least one memory media disk and a data transducer to at least read data from selected locations of the at least one memory media disk and produce analog electrical transducer signals in response thereto. A preamplifier amplifies the analog electrical transducer signals to produce preamplified analog electrical signals. The preamplifier includes an input transistor and an output transistor connected in cascade configuration. First and second current sources are connected to establish respective first and second currents in the input and output transistors, the first and second current sources supplying bias currents that are proportional to an inverse of the product of the square of a reference resistance, the carrier mobility, and the oxide capacitance. First and second resistors are connected between respective input and output terminals of the input and output transistors.

BRIEF DESCRIPTION OF THE DRAWING

The invention is illustrated in the various figures of the drawing, briefly described as follows.

FIG. 1 is an electrical schematic diagram of a circuit for controlling the gain variations of a CMOS reader amplifier, in accordance with the prior art.

FIG. 2 is an electrical schematic diagram of a modification of the circuit of FIG. 2, showing a BiCMOS circuit for controlling the gain variations of a CMOS reader amplifier.

In the various figures of the drawing, like reference numerals are used to denote like or similar parts.

DETAILED DESCRIPTION OF PREFERRED EMBODIMENT

Figure 3:
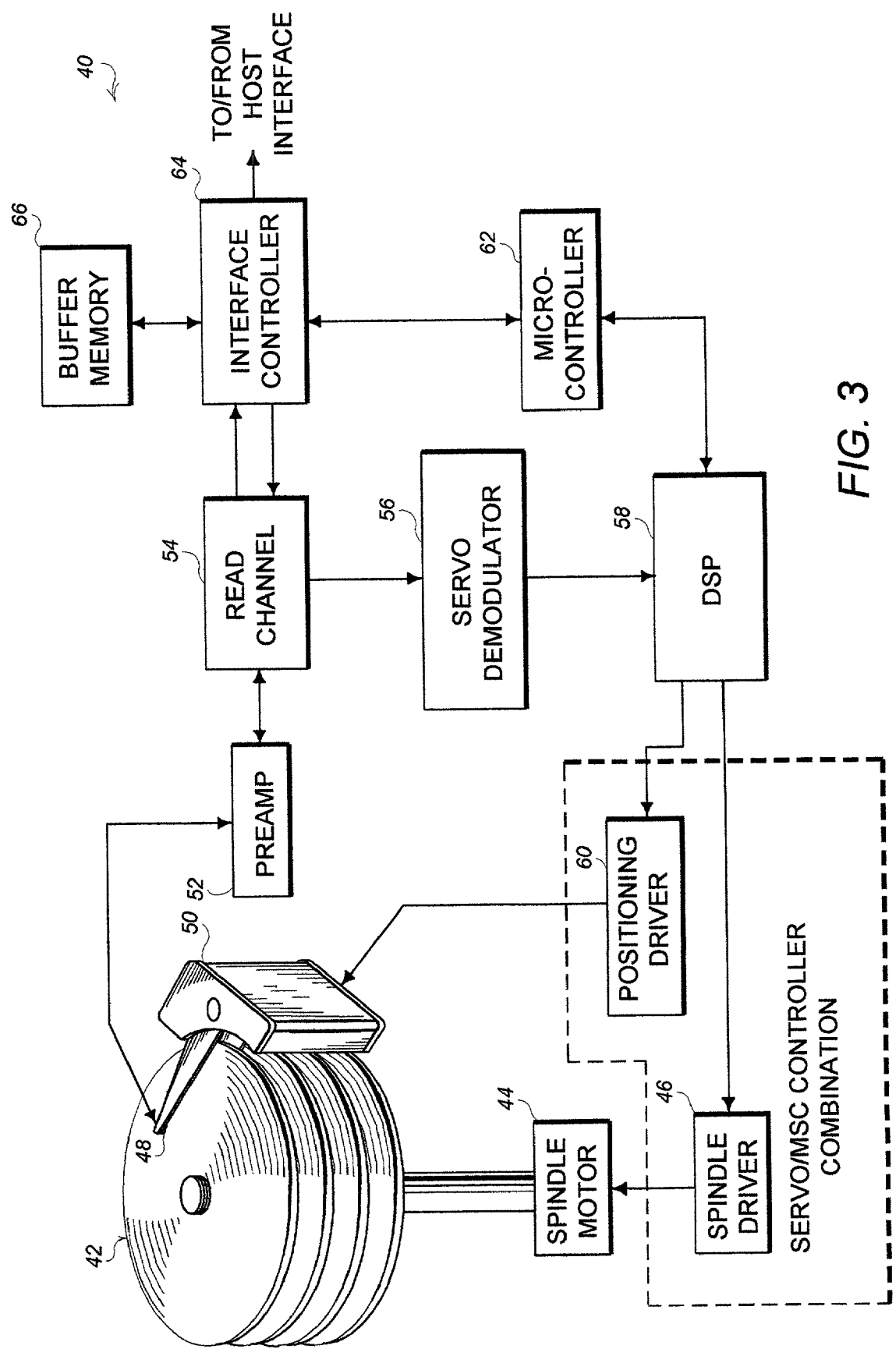
FIG. 3 is a block diagram of a generic disk drive system, illustrating the general environment in which the invention may be practiced.

FIG. 3 is a block diagram of a generic disk drive system 40, which represents the general environment in which the invention may be practiced. The system 40 shows a typical magnetic disk hard disk drive system, although it should be noted that the invention may be practiced in conjunction with other types of mass data storage devices, as well. The disk drive system 40 includes a magnetic media disk 42 that is rotated by a spindle motor 44 and spindle driver circuit 46. A data transducer or head 48 is locatable along selectable radial tracks (not shown) of the disk by a voice coil motor 50. The radial tracks may contain magnetic states that contain information about the tracks, such as track identification data, location information, synchronization data, as well as user data, and so forth. The head 48 may be used both to record user data to and read user data back from the disk 42, as well as to detect signals that identify the tracks and sectors at which data is written, and to detect servo bursts that enable the head 18 to be properly laterally aligned with the tracks of the disk.

Analog electrical signals that are generated by the head 48 in response to the magnetic signals recorded on the disk 42 are preamplified by a preamplifier 52 for delivery to read channel circuitry 54. The reader amplifier referred to above may be contained, for example, in the preamplifier block 52. Servo signals are detected and demodulated by one or more servo demodulator circuits 56 and processed by a digital signal processor (DSP) 58 to control the position of the head 48 via the positioning driver circuit 60. The servo data that is read and processed may be analog data that is interpreted by the DSP 58 for positioning the head 48.

A microcontroller 62 is typically provided to control the DSP 58, as well as an interface controller 64 to enable data to be passed to and from a host interface (not shown) in known manner. A data memory 66 may be provided, if desired, to buffer data being written to and read from the disk 42.

Figure 4:
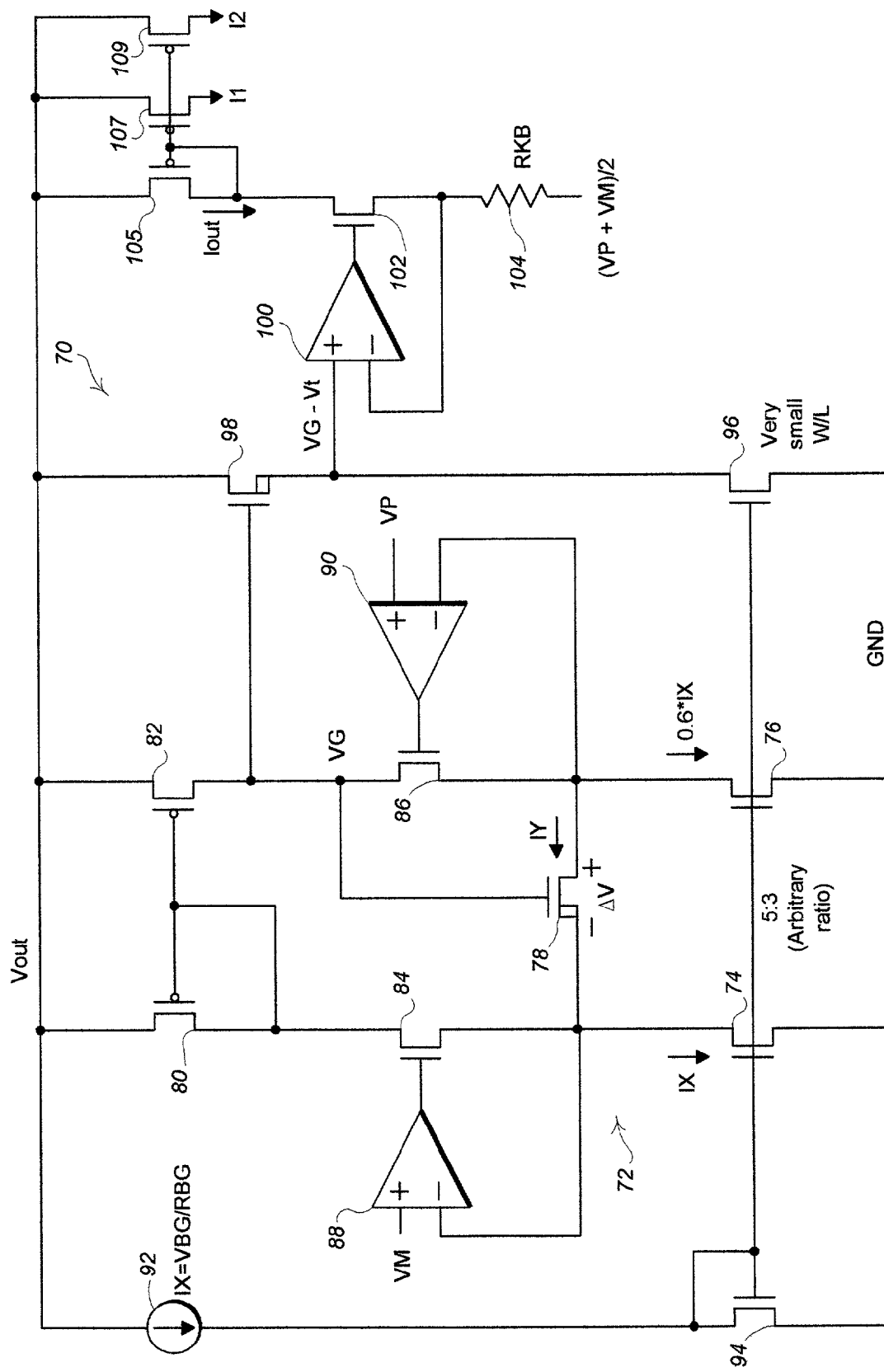
FIG. 4 is an electrical schematic diagram of a special bias circuit for controlling the gain variations of a CMOS reader amplifier, in accordance with a preferred embodiment of the invention.

The invention is directed primarily to improvements in the preamplifier circuitry 52 to reduce the dependence thereof on temperature variations. An electrical schematic diagram of a bias circuit 70 for controlling the gain variations of a CMOS reader amplifier, in accordance with another preferred embodiment of the invention, is shown in FIG. 4, to which reference is now additionally made. A core circuit 72 of the type described above includes an input transistor 84 and output transistor 86 having their sources interconnected with a transistor load 78. The inputs at the gates of respective input transistors 84 and 86 receive input signals from the outputs of respective differential amplifiers 88 and 90.

The sources of transistors 84 and 86 are connected to respective load transistors 74 and 76, which provide current flow paths, which, due to the respective arbitrary sizing of transistors 74 and 76, respectively carry currents IX and 0.6*IX. In the circuit embodiment shown, for example, the ratio of transistor 74 to transistor 76 may be 5:3. Current to the input transistor 84 and the output transistor 86 is provided by current source transistors 80 and 82, respectively.

A voltage reference is provided to the circuit 70 by a current source 92 in series with a diode connected transistor 94, the common gates on transistors 94, 74, 76, and 96 receiving the voltage on the drain of transistor 94. The value of the current supplied by the current source 92 is IX, which is equal to VBG/RBG. VBG is the bandgap reference voltage, and RBG is an internal on-chip resistor. The output is developed between the source of the NMOS transistor 98 and the drain of the NMOS transistor 96 for delivery to a first input of a differential amplifier 100. It should be noted that a very small W/L ratio of the NMOS transistor 96 results in the branch in which transistor 96 exists to have a very small current, such that the Vgs of NMOS transistor 98 is approximately equal to Vt.

The output of the differential amplifier 100 controls the output current, Iout, flowing through the output transistor 102. The current Iout develops a voltage on a resistor RKB 104 that is fed back to the second input of the differential amplifier 100. The bottom side of the resistor RKB 104 is referenced to a voltage that is the average of voltages VM and VP, the reference voltage inputs to amplifiers 88 and 90. Output currents I1 and I2 may be mirrored from current Iout by mirror transistors 105, 107 and 109, as shown. It should be noted that the output currents I1 and I2 are substitutions for the current sources 16 and 24 of FIG. 1.

In operation, the load transistor 78 provides a current flow path between the current flow paths through transistors 74 and 76. Because the transistors 74 and 76 are differently sized, and therefore carry different currents, the balanced currents provided by transistors 80 and 82 produce a current differential IY, which flows through the load transistor 78. This, in turn, produces a voltage $\Delta V$ across the load transistor 78 that is equal to the voltage difference between the sources of input transistors 86 and 84. In the circuit 70 shown, $\Delta V$ is therefore equal to VP-VM.

In the design of the circuits described above, addition to meeting a ±20% gain tolerance, if gain is stabilized over process, voltage, and temperature variations (PVT), then input-referred noise will also be stabilized over PVT. The following analysis may be used in stabilizing the circuit over PVT.

The transconductance of an MOS input transistor is $$gm = \sqrt{\frac{2*I*u*Co*W}{L}},$$

where I is the drain-to-source current, u is the carrier mobility, Co is the oxide capacitance, W is the channel width, and L is the channel length of the transistor.

Thus, to stabilize gain, the current, I, through the transistor should be $$I \propto \frac{1}{u*Co*R_{int}^2},$$

that is, the current should be proportional to the inverse of the square of the resistance Rint, so that $$gm \propto \frac{1}{R_{int}}$$

In the circuit of FIG. 4, $\Delta V$=VP−VM=100 mV (for example, $\Delta V$ being an arbitrary voltage difference for arbitrary VP−VM values resulting therein.)

Solving current mirror equations:

$$IX-IY=IY+0.6*IX$$

$$IY=0.2IX$$

Thus, the transconductance of the load transistor 78, which is referred to as gds, is:

$$gds = \frac{IY}{\Delta V} = \frac{0.2*IX}{VP-VM}.$$

Also for the load transistor 78:

$$Id = \frac{\mu*Co*W}{L}*\left(Vgs - Vt - \frac{Vds}{2}\right)*Vds$$

For a small Vds, $$gds = \frac{\partial Id}{\partial Vds} \approx \frac{\mu*Co*W}{L}*\left(Vgs - Vt - \frac{Vds}{2}\right)$$

Therefore, $$\frac{0.2*IX}{VP-VM} = \frac{\mu*Co*W}{L}*\left(VG-VM-Vt-\frac{VP-VM}{2}\right) = \frac{\mu*Co*W}{L}*\left(VG-Vt-\frac{VP+VM}{2}\right)$$

But, $Iout = \dfrac{VG - Vt - \dfrac{VP+VM}{2}}{RKB}$

Thus, $Iout = \dfrac{0.2*IX}{VP-VM} * \dfrac{L}{\mu*Co*W} * \dfrac{1}{RKB} = \dfrac{0.2}{VP-VM} * \dfrac{VBG}{RBG} * \dfrac{L}{\mu*Co*W} * \dfrac{1}{RKB}$ using $$IX = VBG/RBG = \frac{0.2*VBG*L}{(VP-VM)*W} * \frac{1}{\mu*Co*RBG*RKB}$$

As mentioned above, one of the goals in the design of the circuits according to the invention is to establish a circuit in which the terms in the current equations are inversely proportional to the inverse of the product of the square of the resistance Rint, the carrier mobility, and the oxide capacitance. It can be seen that this is accomplished in this equation using the reciprocal of the resistance RKB 104 and RBG. Thus, conceptually, under PVT changes, VG will move around to keep a constant gds for the load transistor 78. Specifically, if µ*Co goes down, then VG goes up.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The invention claimed is:

1. An amplifier, comprising:
    an input transistor and an output transistor connected in cascade configuration;
    first and second current sources connected to establish respective first and second currents in said input and output transistors, said first and second current sources supplying bias currents that are proportional to an inverse of a product of an external reference resistance, a carrier mobility, and an oxide capacitance;
    and first and second resistors connected between respective input and output terminals of said input and output transistors.

2. The circuit of claim 1 wherein said input and output transistors are MOS transistors.

3. The circuit of claim 1 wherein said input transistor is a MOS transistor and said output transistor is a bipolar transistor.

4. The circuit of claim 1 further comprising a isolation transistor connected in series with said input transistor to reduce an input capacitance of said amplifier.

5. The circuit of claim 1 wherein at least said resistor connected between input and output terminals of said output transistor is a MOS transistor.

6. A circuit for controlling gain variations of an amplifier, comprising:
    first and second current sources to establish currents in respective first and second current flow paths;
    first and second input transistors respectively in said first and second current flow paths, an input signal being connected to a control element of said first transistor; and
    a load element connected between said first and second current flow paths to allow said first and second transistors to carry currents in proportion to an inverse of a the product of the carrier mobility, the oxide capacitance, and an external reference resistor.

7. The circuit of claim 6 wherein said load element is a resistor.

8. The circuit of claim 6 wherein said load element is a third transistor.

9. The circuit of claim 6 wherein said first and second transistors are MOS transistors.

10. The circuit of claim 6 wherein said first transistor is a MOS transistor and said second transistor is a bipolar transistor.

11. A mass data storage device, comprising:
    at least one memory media disk;
    a data transducer to at least read data from selected locations of said at least one memory media disk and produce analog electrical transducer signals in response thereto;
    a preamplifier to amplify said analog electrical transducer signals to produce preamplified analog electrical signals, said preamplifier comprising:
    an input transistor and an output transistor connected in cascade configuration;
    first and second current sources connected to establish respective first and second currents in said input and output transistors, said first and second current sources supplying bias currents that are proportional to an inverse of a product of a square of an external reference resistance, a carrier mobility, and an oxide capacitance;
    and first and second resistors connected between respective input and output terminals of said input and output transistors.

12. The mass data storage device of claim 11 wherein said at least one memory media disk comprises a magnetic media disk.

13. The mass data storage device of claim 11 wherein said data transducer further records data to said at least one memory media disk.

14. The circuit of claim 11 wherein said input and output transistors are MOS transistors.

15. The circuit of claim 11 wherein said input transistor is a MOS transistor and said output transistor is a bipolar transistor.

16. The circuit of claim 11 further comprising a isolation transistor connected in series with said input transistor to reduce an input capacitance of said amplifier.

17. The circuit of claim 11 wherein at least said resistor connected between input and output terminals of said output transistor is a MOS transistor.

18. A mass data storage device, comprising:
    at least one memory media disk;
    a spindle motor connected to spin said at least one memory media disk;
    a spindle driver circuit to control said spindle motor;
    a data transducer to at least read data from said at least one memory media disk and produce analog electrical transducer signals in response thereto;
    a voice coil motor connected to move said data transducer radially with respect to said at least one memory media disk;
    a positioning driver circuit to command said voice coil motor to locate said data transducer to a selected radial locations of said at least one memory media disk;
    a preamplifier to amplify said analog electrical transducer signals to produce preamplified analog electrical signals;
    read channel circuitry to receive said preamplified analog electrical signals;
    at least one servo demodulator to produce detected and demodulated signals from said preamplified analog electrical signals from said read channel circuitry;
    a digital signal processor for processing said detected and demodulated signals to control a selected radial position of said data transducer via said positioning driver circuit according at least in part to servo data that is read from said at least one memory media disk;

said digital signal processor also controlling said spindle driver circuit to spin said at least one memory media disk;
a microcontroller to control said digital signal processor; and
an interface controller to enable data to be passed to and from a host interface;
wherein said preamplifier comprises:
an input transistor and an output transistor connected in cascade configuration;
first and second current sources connected to establish respective first and second currents in said input and output transistors, said first and second current sources supplying bias currents that are proportional to an inverse of a product of a square of an external reference resistance, a carrier mobility, and an oxide capacitance;
and first and second resistors connected between respective input and output terminals of said input and output transistors.

19. The mass data storage device of claim 18 wherein said at least one memory media disk comprises a magnetic media disk.

20. The mass data storage device of claim 18 wherein said data transducer further records data to said at least one memory media disk.

21. The mass data storage device of claim 20 further comprising a data memory to buffer data being written to and read from said at least one memory media disk.

22. The circuit of claim 18 wherein said input and output transistors are MOS transistors.

23. The circuit of claim 18 wherein said input transistor is a MOS transistor and said output transistor is a bipolar transistor.

24. The circuit of claim 18 further comprising a isolation transistor connected in series with said input transistor to reduce an input capacitance of said amplifier.

25. The circuit of claim 18 wherein at least said resistor connected between input and output terminals of said output transistor is a MOS transistor.

* * * * *